US007007809B2

(12) United States Patent
Greenside

(10) Patent No.: US 7,007,809 B2
(45) Date of Patent: Mar. 7, 2006

(54) SYSTEM FOR SUPPORTING A BACKPLANE BETWEEN CARD CAGES

(75) Inventor: Michael J. Greenside, Granite Bay, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 9 days.

(21) Appl. No.: 10/140,902

(22) Filed: May 6, 2002

(65) Prior Publication Data
US 2003/0205541 A1 Nov. 6, 2003

(51) Int. Cl.
*A47G 19/08* (2006.01)

(52) U.S. Cl. .................... 211/41.17; 211/183; 211/184; 211/189; 361/788

(58) Field of Classification Search ............. 211/41.17, 211/40, 45, 50, 186, 187, 188, 189, 190, 175, 211/207, 208, 184, 153, 183; 361/752–753, 361/729, 796, 797, 816, 714, 724–725, 756, 361/788, 801, 802, 829; 108/60, 193, 180; 312/223.1, 223.2, 351, 108, 128, 257.1, 265.5, 312/265.6
See application file for complete search history.

(56) References Cited

U.S. PATENT DOCUMENTS

| | | | | |
|---|---|---|---|---|
| 3,723,823 A | * | 3/1973 | Lit et al. ..................... 361/802 |
| 3,788,241 A | * | 1/1974 | Ravreby ........................ 108/6 |
| 3,810,433 A | * | 5/1974 | Posner ..................... 211/41.17 |
| 3,838,777 A | * | 10/1974 | Thornicroft et al. ..... 211/41.17 |
| 4,327,835 A | * | 5/1982 | Leger ....................... 211/41.17 |
| 4,328,898 A | * | 5/1982 | Grassi ..................... 211/41.17 |
| 4,501,368 A | * | 2/1985 | Gill .......................... 211/41.17 |
| 4,506,607 A | * | 3/1985 | Jacoby ......................... 108/60 |
| 4,602,829 A | * | 7/1986 | De Andrea .............. 312/223.1 |
| 4,700,275 A | * | 10/1987 | Wood ......................... 361/729 |
| 4,928,833 A | * | 5/1990 | Huizenga .................... 211/187 |
| 5,269,601 A | * | 12/1993 | Williams et al. ......... 312/406.1 |
| 5,439,123 A | * | 8/1995 | Nook .......................... 211/187 |
| 5,490,011 A | * | 2/1996 | Pernick et al. .............. 359/601 |
| 5,524,980 A | * | 6/1996 | Carter et al. ................ 312/351 |
| 5,713,649 A | * | 2/1998 | Swift ....................... 312/257.1 |
| 5,752,610 A | * | 5/1998 | Remmers ................. 211/181.1 |
| 5,828,556 A | * | 10/1998 | Zenitani et al. ............. 361/802 |
| 5,848,711 A | * | 12/1998 | Schmit .................... 211/90.04 |
| 5,931,553 A | * | 8/1999 | Cohen ........................ 312/263 |
| 6,175,507 B1 | * | 1/2001 | Koradia et al. ............. 361/796 |
| 6,239,984 B1 | * | 5/2001 | Koradia et al. ............. 361/784 |
| 6,272,016 B1 | * | 8/2001 | Matonis et al. ............. 361/716 |
| 6,285,563 B1 | * | 9/2001 | Nelson et al. .............. 361/784 |
| 6,288,902 B1 | * | 9/2001 | Kim et al. .................. 361/725 |
| 6,325,472 B1 | | 12/2001 | Tirrell et al. |
| 6,424,526 B1 | * | 7/2002 | Heard ......................... 361/687 |
| 6,434,018 B1 | * | 8/2002 | Waltz ......................... 361/796 |
| 6,442,035 B1 | * | 8/2002 | Perry et al. ................. 361/756 |
| 6,456,498 B1 | * | 9/2002 | Larson et al. ............... 361/752 |

(Continued)

FOREIGN PATENT DOCUMENTS

EP 0438014 A2 7/1991

(Continued)

*Primary Examiner*—Jennifer E. Novosad

(57) ABSTRACT

A card cage includes first and second card cage walls; a first, upper pair of members, comprising a front and a rear member, supported between the first and second card cage walls; a second, lower pair of members, comprising a front and a rear member, supported between the first and second card cage walls; a backplane supported between the front members and the rear members; and a plurality of alignment pins. The alignment pins are inserted through corresponding holes in the backplane and the front and rear members.

34 Claims, 8 Drawing Sheets

U.S. PATENT DOCUMENTS

| | | | |
|---|---|---|---|
| 6,466,449 B1 * | 10/2002 | Sheen et al. | 361/752 |
| 6,474,480 B1 * | 11/2002 | Negishi | 211/41.17 |
| 6,502,702 B1 * | 1/2003 | Hsue et al. | 211/26 |
| 2002/0063100 A1 * | 5/2002 | Kwang | 211/40 |
| 2002/0131257 A1 * | 9/2002 | Agard | 361/796 |
| 2003/0051088 A1 * | 3/2003 | Ho et al. | 710/300 |

FOREIGN PATENT DOCUMENTS

EP  0438014 A3  7/1991

* cited by examiner

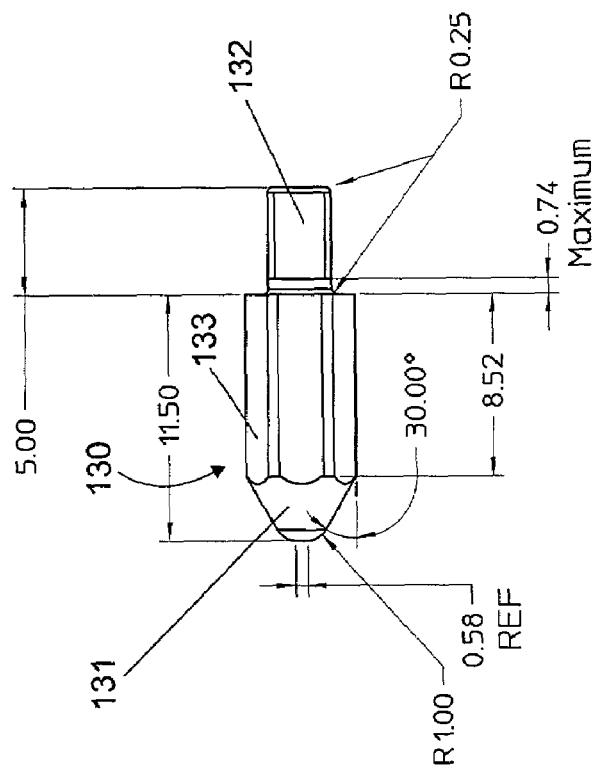
FIG. 3
FIG. 3a
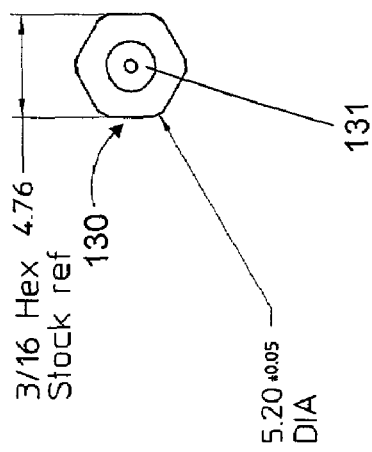
FIG. 3b

SYSTEM FOR SUPPORTING A BACKPLANE BETWEEN CARD CAGES

FIELD OF THE INVENTION

The present invention relates to the field of computers. More specifically, the present invention relates to the field of computer cards and printed circuit boards that are connected to a common board or backplane. The present invention provides novel means and methods for constructing, assembling and disassembling a card cage containing a backplane and a number of connected cards or circuit boards.

BACKGROUND OF THE INVENTION

Computers and computer networks are indispensable in modern society. We use computers and computer networks for everything from communication to record storage. Because of the incredible need for computer resources, there is a constant trend toward packaging more and more hardware into less space.

A backplane is a circuit board into which other circuit boards or cards are plugged to provide additional resources or functionality. The backplane provides common resources for the boards or cards it supports. The motherboard in a personal computer may be referred to as a backplane.

A card cage is the central part of the computer where various Printed Circuit Boards (PCBs) are plugged into a centralized backplane. The card cage typically encloses the backplane and card guides for assisting with the connection of cards or other PCBs to the backplane. The backplane houses all of the mating connectors for the installed cards. Many card cages conform to the Compact Peripheral Component Interconnect (CPCI) standard or the Versa Modular Eurocard (VME) standard.

Industry standard VME/CPCI card cages are all basically of the same design. The CPCI card cages can be deployed to support cards being interfaced with one or both sides of the backplane. Obviously, the card cage is larger and more complicated if it supports cards connected to both the front and back sides of the backplane.

A typical CPCI card cage has four front aluminum extrusions that must be fixed in place on the front side of the backplane. Aluminum Extrusions are required for CPCI and VME card cages due to the complex Printed Circuit Board plastic levers and screws that must interface into them. The four card cage extrusions are secured with screws at both ends to the card cage walls. This requires eight total screws that are small and difficult to handle.

Plastic card guides are then added one at a time or in clusters. The plastic card guides guide cards or PCBs that are being connected to the backplane. The card guides also physically support the cards or PCBs after installation. The card guides are, in turn, supported on the card cage extrusions.

On the backside of the card cage, the backplane is attached to the extrusions by numerous M2.5 screws. The M2.5 screws are very small metric screws that are also very difficult to handle.

Also at the rear of the backplane, a rear portion of the card cage can be constructed to support card and PCBs that are plugged into the rear side of the backplane. When Expansion PC Boards (short PC Boards) are to be connected to the rear of the backplane, two rear card cage aluminum extrusions are fixed in place within the backside of the card cage. The two extrusions are screwed to both sides of the card cage wall with four additional screws total. If full-depth PC Boards are to be connected to the backside of the backplane, then four rear card cage extrusions are used. Again, these extrusions are secured in place against the card cage wall with eight screws, one at each end of each extrusion.

Once the rear extrusions are in place, rear plastic card guides are then added one at a time or in clusters. As before, the plastic card guides guide the cards or PCBs that are being connected to the backplane. The card guides also physically support the cards or PCBs after installation. The card guides are, in turn, supported on the card cage extrusions.

In order to repair and replace the backplane, the entire rear card cage must be disassembled. This requires undoing the assembly steps described above in reverse order, right down to removing all of the small screws. This is a tedious process. Moreover, if one drops a screw to the bottom of the card cage or into another component, such as the power supply, etc., then the repair can become extremely difficult.

SUMMARY OF THE INVENTION

In one of many possible embodiments, the present invention provides a member for supporting card guides and a backplane. The member includes a first edge along which is disposed a bar for abutting the backplane and a second edge along which is disposed a standard interface. Preferably, the member is a single, integrated piece.

In another embodiment, the present invention provides an assembly that includes a backplane, a front member, a rear member, and a plurality of alignment pins. The backplane is supported between the front and rear members, the alignment pins being inserted through corresponding holes in the backplane and the front and rear members.

In another embodiment, the present invention provides a card cage that includes first and second card cage walls; a first, upper pair of members, comprising a front and a rear member, supported between the first and second card cage walls; a second, lower pair of members, comprising a front and a rear member, supported between the first and second card cage walls; a backplane supported between the front members and the rear members; and a plurality of alignment pins. The alignment pins are inserted through corresponding holes in the backplane and the front and rear members.

In another embodiment, the present invention provides a method of assembling a card cage, the method by supporting a pair of rear members between first and second card cage walls, the rear members being spaced apart vertically; connecting a backplane to the members; and supporting a pair of front members between the first and second card cage walls, the front members being spaced apart vertically and supporting the backplane along with the rear members.

In another embodiment, the present invention provides a method of disassembling a card cage for repair or replacement of a backplane contained in the card cage by removing screws supporting two front members; removing two front members supported between left and right side walls of the card cage, where the two front members help support the backplane and removing the front members exposes the backplane; and repairing the backplane.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

FIG. 3, comprising FIGS. 3a and 3b, is an illustration of an alignment pin according to one embodiment of the present invention. The alignment pin of FIG. 3 is used to connect the extrusion of FIG. 1 to a backplane.

Throughout the drawings, identical reference numbers designate identical elements.

DETAILED DESCRIPTION OF THE PREFERRED EMBODIMENTS

Figure 1:
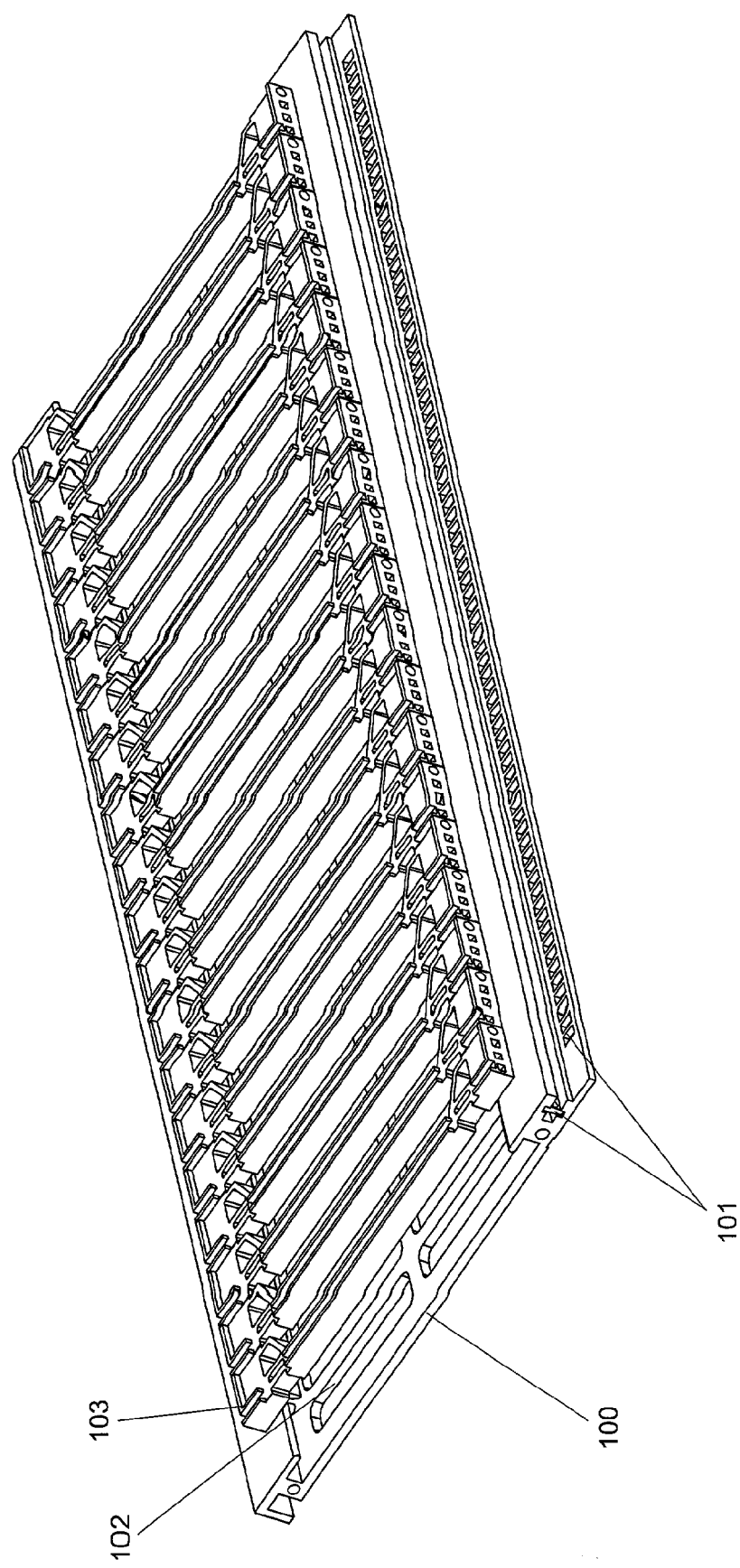
FIG. 1 is an illustration of a card cage extrusion according to one embodiment of the present invention.

FIG. 1 is an illustration of a card cage extrusion according to one embodiment of the present invention. The exemplary card cages discussed herein as embodiments of the present invention preferably conform to the Compact Peripheral Component Interconnect (CPCI) standard or the Versa Modular Eurocard (VME) standard. However, the invention concept is applicable to any computer card cage.

As shown in FIG. 1, the card cage extrusion (100) of the present invention is preferably a single extruded piece. Preferably, the extrusion (100) is made of aluminum, consistent with the CPCI/VME standards.

Air holes (102) are provided in the body of the extrusion (100). Preferably, the extrusion (100) is formed without air holes (102). The holes (102) are then machined into the body of the extrusion (100). These air holes (102) provide enhanced air circulation and cooling of components in the card cage.

The structure (101) along one side of the extrusion (100) is an interface required by the CPCI/VME standards. Because this interface (101) is part of a the CPCI/VME standards, additional details about the interface are unnecessary here.

Card guides (103) are disposed on top of the extrusion (100). The card guides (103) are preferably made of plastic and can be installed individually, in sections, or as an integrated unit as illustrated if FIG. 1. Under the principles of the present invention, the card guides (103) preferably snap onto the extrusion (100) as will be explained in more detail below. The card guides (103) guide cards and PCBs during connection with the backplane and provide physical support for the cards and PCBs after installation.

Because of the extrusion (100) is a single piece and supports the card guides (103), the card guides (103) do not need to be removed from the extrusion (100) if the card cage is being disassembled. Thus, if repairs must be made to the backplane or the backplane replaced, the extrusion (100) and card guides (103) can be treated as a single piece during disassembly. This greatly simplifies access to the backplane for repair or replacement purposes.

As implied by the word "extrusion," the extrusion (100) may be formed from an extruded material. As will be appreciated by those skilled in the art, a member functionally equivalent to the extrusion (100) could also be formed of sheet metal. Thus, references herein and in the appended claims to an "extrusion" will be understood to encompass a piece such as that illustrated in FIG. 1, whether made from extruded material, sheet metal or some other means.

Figure 2:
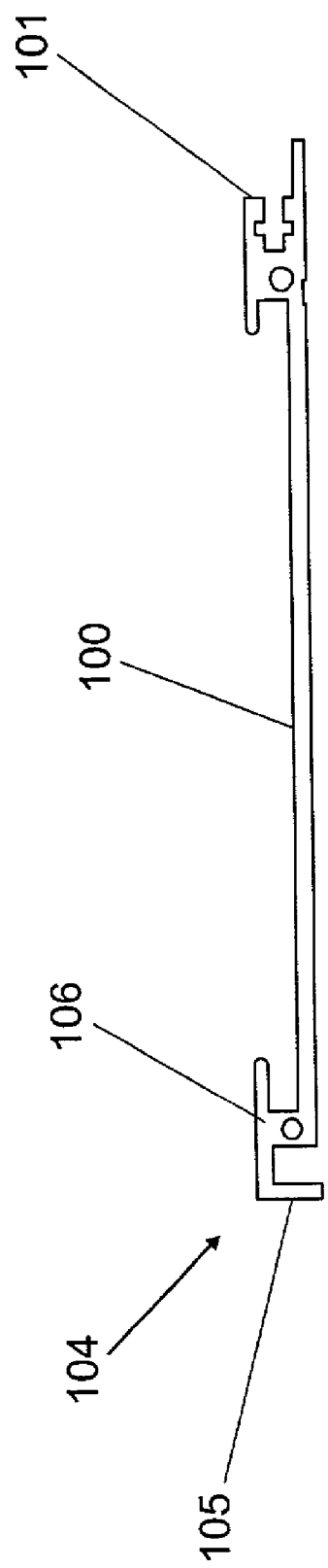
FIG. 2 is an end-on view of the card cage extrusion illustrated in FIG. 1 and according to one embodiment of the present invention.

FIG. 2 is an end-on view of the card cage extrusion (100) that is illustrated in FIG. 1 and described above according to one embodiment of the present invention. As shown in FIG. 2, and as described above, the extrusion (100) provides a standard CPCI/VME interface (101) along one edge. Along the opposite edge is a bar (104) with a vertical surface (105) and a horizontal surface (106). As will be described in detail below, the vertical surface (105) abuts the backplane when the extrusion (100) is installed in a complete card cage assembly. The horizontal surface (106) supports and connects to one edge of the card guide unit (103).

FIG. 3, comprising FIGS. 3a and 3b, is an illustration of an alignment pin according to one embodiment of the present invention. The alignment pin of FIG. 3 is used to connect the extrusion of FIG. 1 with a backplane.

As shown in FIG. 3a, an alignment pin (130) according to the present invention has a central length (133) with a hexagonal cross-section. FIG. 3b is an end-on view of the pin (130) that illustrates the preferred hexagonal cross-section. Behind the central length (133), the pin (130) includes a narrower threaded tail portion (132). At the other end of the central length (133), the pin (130) is machined to provide a bullet nose head (131), and radiuses on the hexagon edges (rounded hexagon) to provide pin-like functionality. The flat sections are desired to provide an area for a tool to grab for threading the alignment pins into the extrusions.

Preferably, the pin (130) is made of 303 stainless steel, hexagon metal stock. The stock is then machined to provide the tail portion (132), bullet nose head and radius around the hexagon body for smooth alignment. (131).

Where a backplane is to be supported between front and rear extrusions (as will be illustrated in more detail below), the hexagon alignment pins are preferably added to the rear of two of the extrusions. The pins are then extended through corresponding holes in the backplane and the front extrusion. Four hexagon-profiled alignment pins are preferably used to connect the backplane between the front and rear extrusions. The hexagonal shape allows a standard tool to rotate the pins (130) into place into tapped holes in each rear extrusion.

Figure 4:
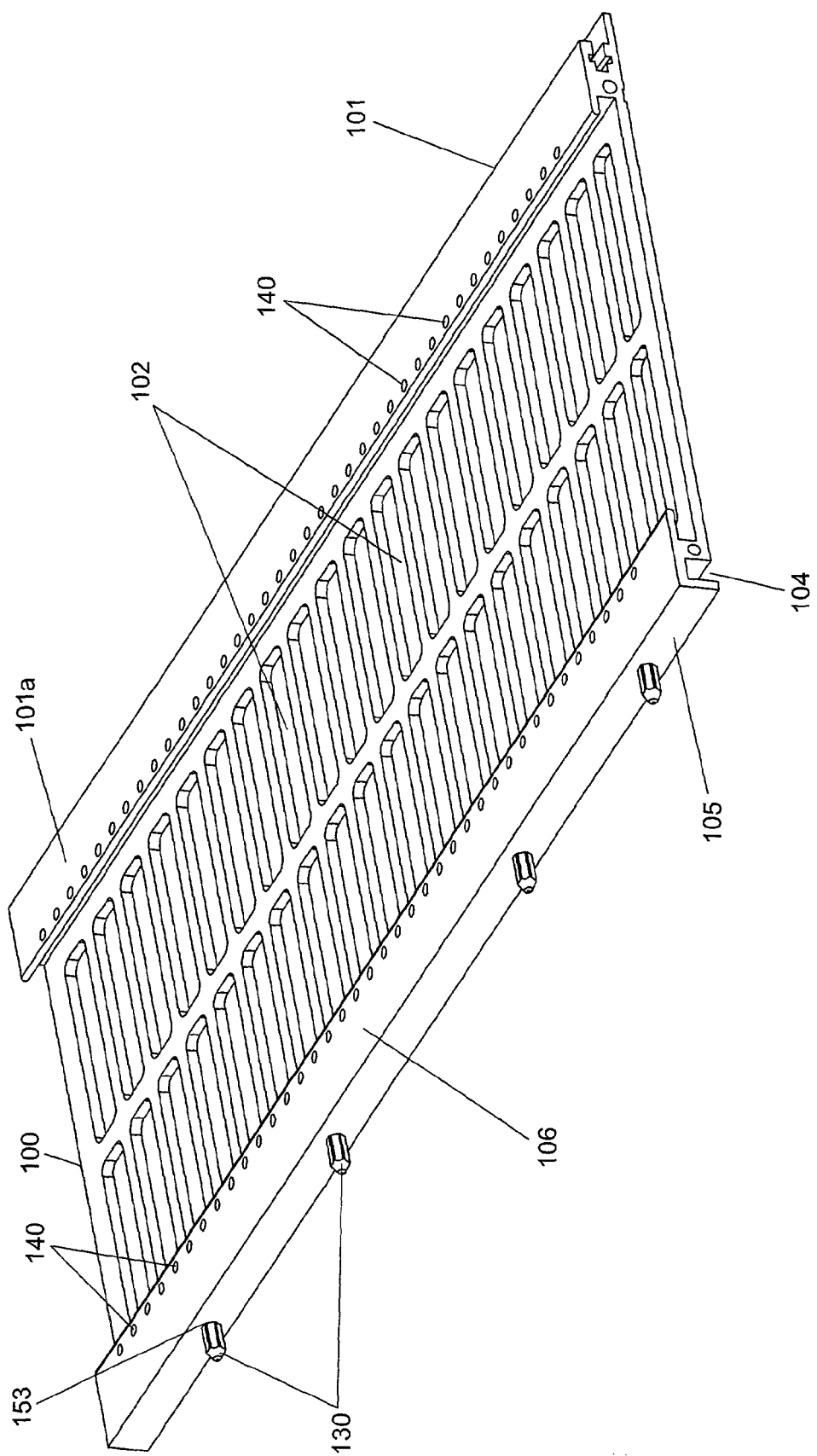
FIG. 4 is an illustration of the card cage extrusion of FIG. 1 with a number of alignment pins in place.

FIG. 4 is an illustration of a card cage extrusion, such as that illustrated in FIG. 1, with a number of alignment pins in place. The installation and use of the alignment pins will be described with reference to FIG. 4.

In FIG. 4, the extrusion (100) is illustrated without the card guides (103; FIG. 1). Consequently, it is possible to see rows of holes (140) that are provided on the horizontal surface (106) of the bar (104) and on a horizontal surface (101a) of the CPCI interface (101). These holes (140) are used to secure the card guide (103; FIG. 1). Corresponding protrusions (not shown) on the underside of the card guide or guides (103; FIG. 1) are snapped into the holes (140) to snap the card guide unit or units (103; FIG. 1) to the extrusion (100).

Additionally, as shown in FIG. 4, the vertical surface (105) of the bar (104) includes a number of tapped holes (153). Alignment pins (130) are threaded into these holes (153). As shown in FIG. 4, the tail end (132) of each pin(130) is preferably threaded into one of the tapped holes (153). As shown in FIG. 4, four pins (130) are preferably spaced along the vertical surface (105) of the bar (104).

As will be illustrated below, the backplane receives and is secured by these pins (130) between front and rear extrusions. The extrusion (100) illustrated in FIG. 4 would preferably be a rear extrusion for a rear side of the backplane.

Figure 5:
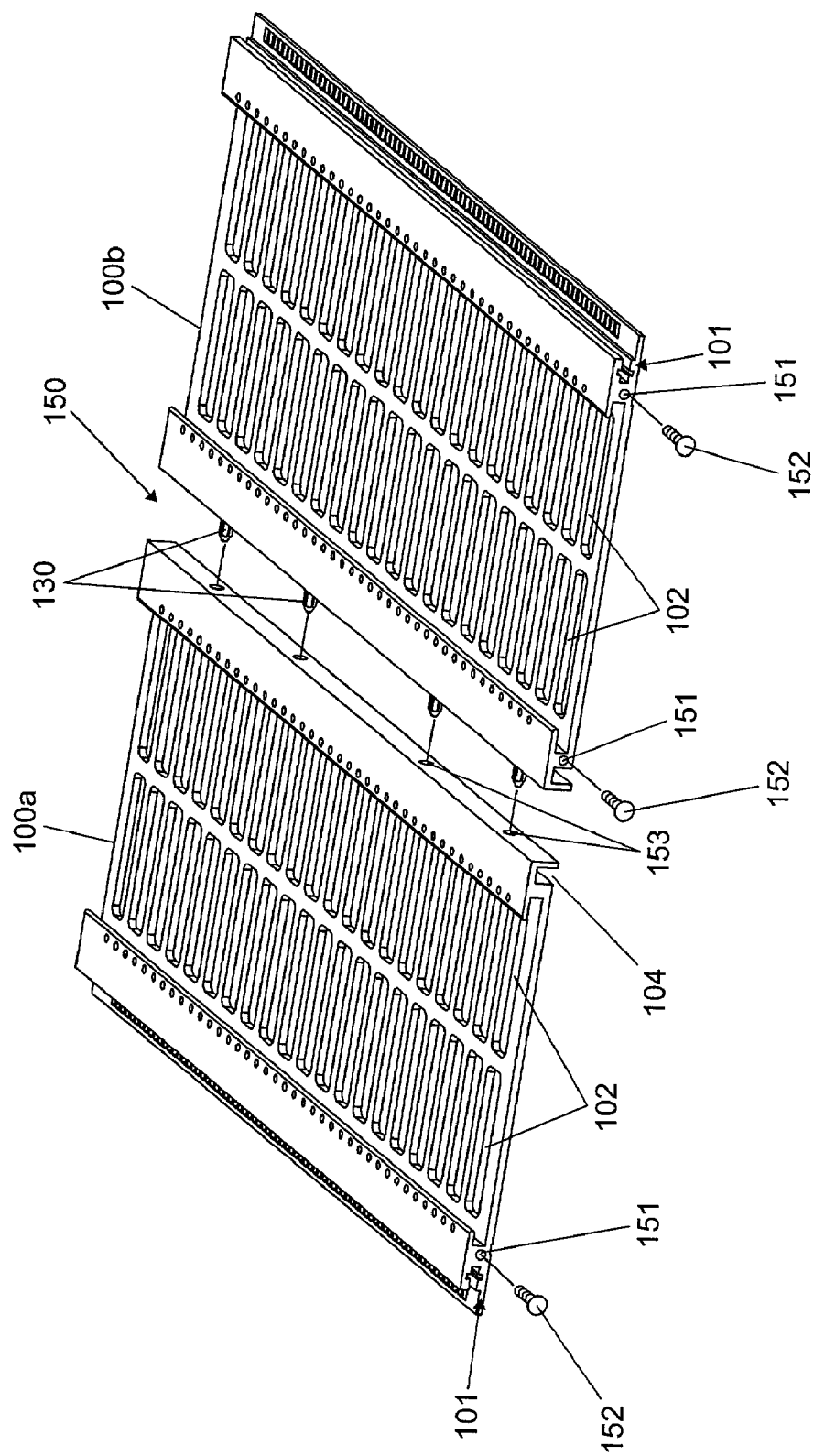
FIG. 5 is an illustration of an extrusion assembly according to an embodiment of the present invention in which two full-size extrusions are positioned for connection with a backplane.

FIG. 5 is an illustration of an extrusion assembly according to an embodiment of the present invention in which two full-size extrusions are positioned for connection with a backplane. The VME/CPCI specification allows for Printed Circuit Boards of various height increments known in the specification as "U" increments. The exemplary card cage presented here as a possible embodiment of the present invention uses "6U" tall Boards. As used herein, "6U" tall standard boards are referred to as full size boards. Note also that the present invention is applicable to any size and type of Printed Circuit Boards that populate either side of a backplane. As shown in FIG. 5, a front extrusion (100a) and a rear extrusion (100b) are positioned opposite each other with a space (150) between them where a backplane will be located.

Each extrusion (100a, 100b) includes a CPCI interface (101) and a bar (104) as described above. The extrusions (100a, 100b) are positioned so that the bars (104) are adjacent each other as shown in FIG. 5. Holes (153) are provided in the bars (104) of each extrusion (100a, 100b) for receiving the alignment pins (130). If there is any difference between the front and rear extrusions (100a, 100b), it is in the sizing of the holes (153) that receive the alignment pins (130). As shown in FIG. 5, it is preferred that the threaded tail portions (132; FIG. 3) of the alignment pins (130) are threaded through the tapped holes (153) in the rear extrusion (100b), while the bullet noses (131; FIG. 3) of the pins (130) are received in the holes (153) in the front extrusion (100a).

As shown in FIG. 5, each end of the bar (104) and each end of the interface (101) on rear extrusions (100b), and each end of the interface (101) on the front extrusions (100a), includes a threaded hole (151) into which a screw (152) can be screwed. As will be illustrated below, these screws (152) are used to attach the extrusions (100a, 100b) between the side walls of the card cage.

Figure 6:
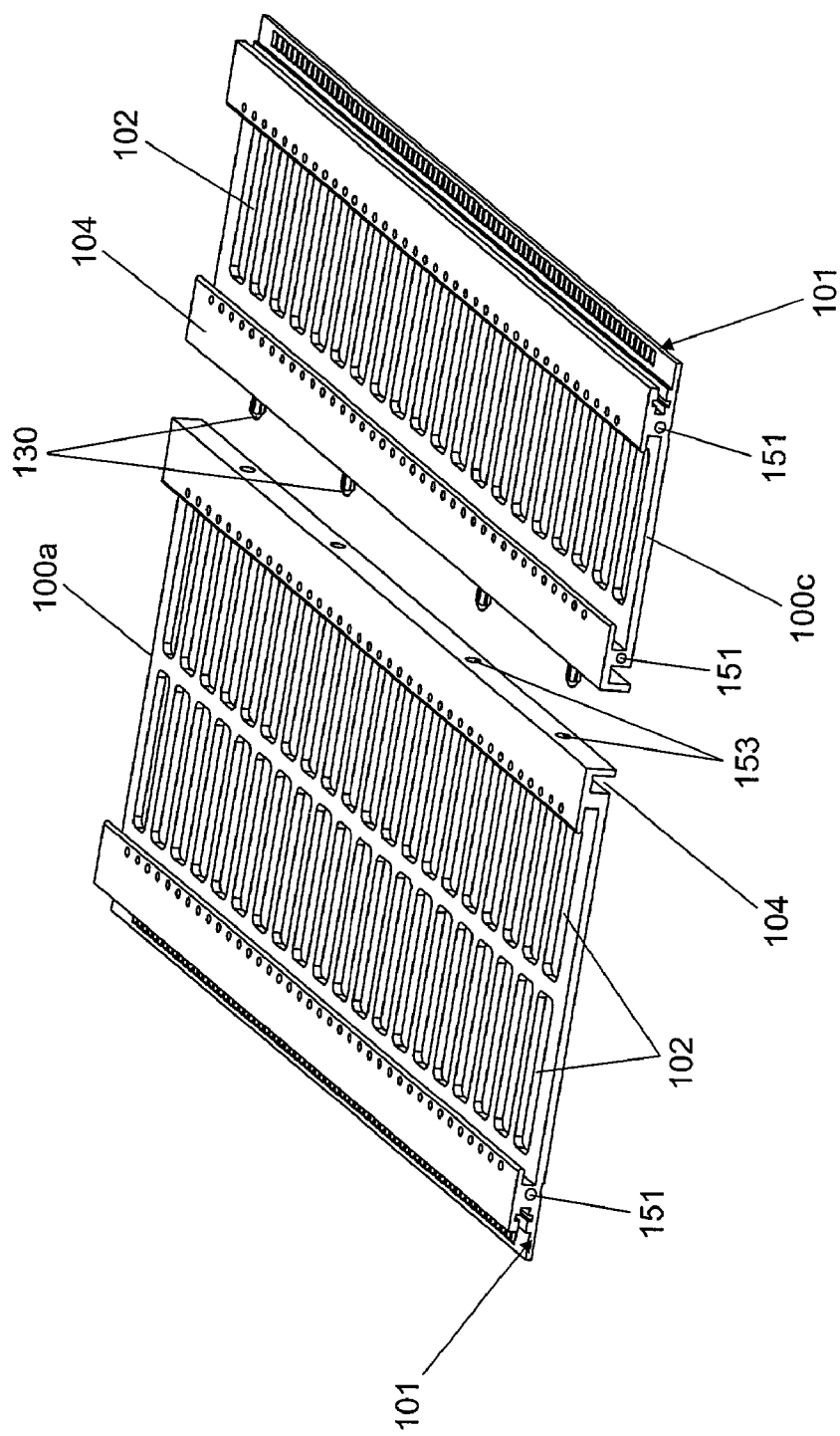
FIG. 6 is an illustration of an extrusion assembly according to another embodiment of the present invention in which one full-size extrusion and one short extrusion are positioned for connection with a backplane.

FIG. 6 is an illustration of an extrusion assembly according to another embodiment of the present invention. In this embodiment, one full-size extrusion and one short extrusion are positioned for connection with a backplane.

Cards and PCBs that connect to a backplane commonly come in numerous sizes. The embodiment illustrated in FIG. 5 shows an assembly designed to accommodate full-sized cards "6U" and PCBs on both sides of a backplane.

In FIG. 6, the assembly is designed to accommodate full-sized cards on the front side of the backplane and expansion PCBs (short PC Boards) on the rear side of the backplane. As shown in FIG. 6, a front extrusion (100a) and a rear extrusion (100c) are positioned opposite each other with a space between them where a backplane will be installed. The rear extrusion (100c) is sized for smaller cards and PCBs.

Each extrusion (100a, 100c) includes a CPCI interface (101) and a bar (104) as described above. The extrusions (100a, 100c) are positioned so that the bars (104) are adjacent each other as shown in FIG. 6. Holes (153) are provided in the bars (104) of each extrusion (100a, 100c) for receiving the alignment pins (130). As shown in FIG. 6, it is preferred that the threaded tail portions (132; FIG. 3) of the alignment pins (130) are threaded through the tapped holes (153) in the rear extrusion (100c), while the bullet noses (131; FIG. 3) of the pins (130) are received in the holes (153) in the front extrusion (100a).

As shown in FIG. 6, each end of the bar (104) and each end of the interface (101) on the rear extrusions (100b), and each end of the interface (101) on the front extrusions (100a), includes a threaded hole (151) into which a screw (152) can be screwed. As will be illustrated below, these are used to attach the extrusions (100a, 100c) to the side walls of the card cage.

Figure 7:
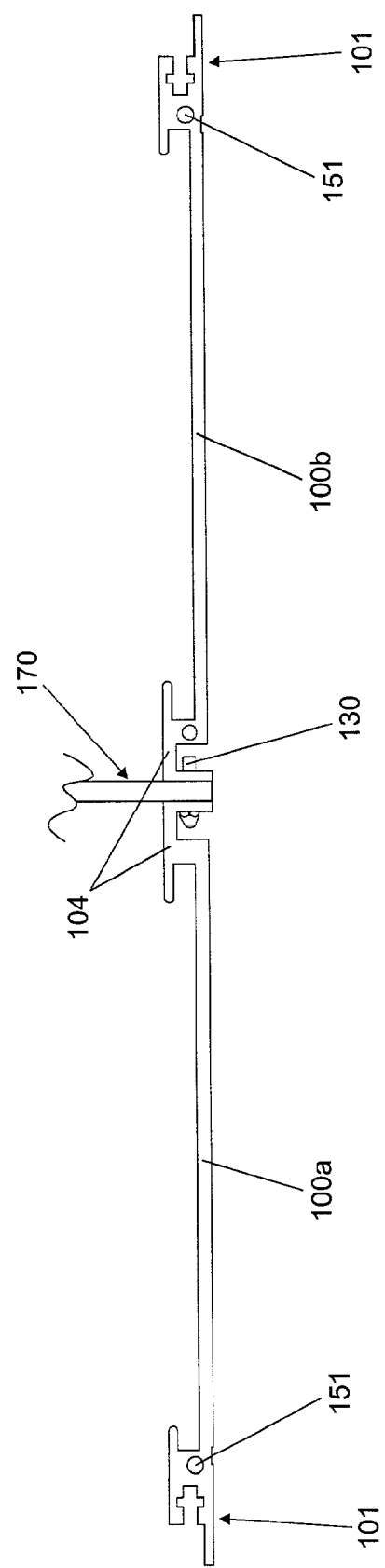
FIG. 7 is an end-on view of the extrusion assembly of FIG. 5, including an illustration of the backplane secured between the front and rear extrusions.

FIG. 7 is an end-on view of the extrusion assembly of FIG. 5, including an illustration of the backplane secured between the front and rear extrusions. As shown in FIG. 7, a backplane (170) stands vertically between the two extrusions (100a, 100b). The bars (104) of the extrusions (100a, 100b) abut the backplane (170). The alignment pins (130) are placed through the backplane (170) and the corresponding holes (153; FIG. 5) in the bars (104) of the front and back extrusions (100a, 100b). In this way, the backplane (170) and the extrusions (100a, 100b) are secured together into a completed assembly.

Figure 8:
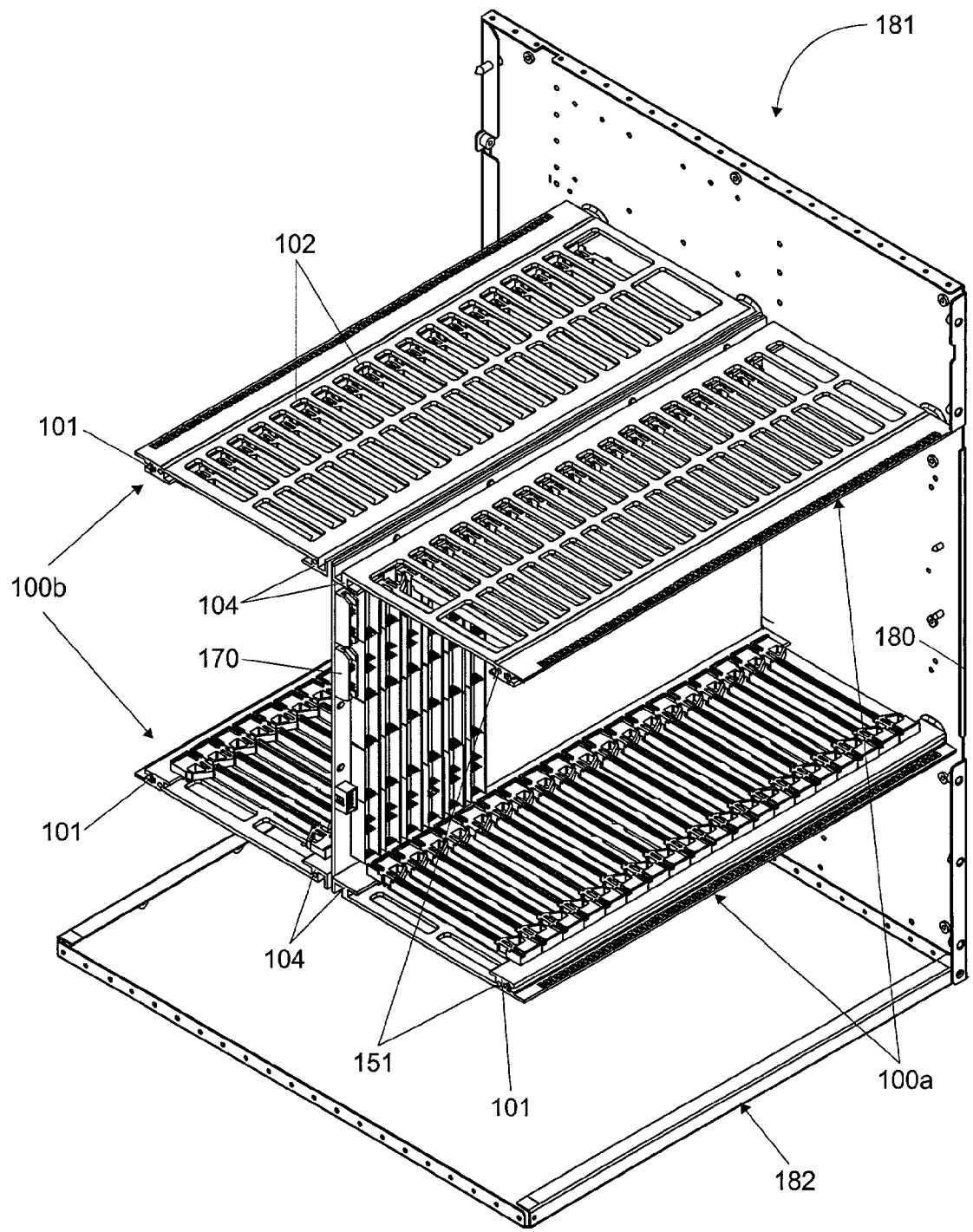
FIG. 8 is an illustration of a card cage assembly according to an embodiment of the present invention. The card cage assembly includes the backplane supported by the front and rear extrusions that are, in turn, supported by the cage walls.

FIG. 8 is an illustration of a card cage assembly according to an embodiment of the present invention. The card cage assembly includes the backplane supported by the front and rear extrusions, which are, in turn, supported by the cage walls.

As shown in FIG. 8, two pair of extrusions (100) maybe used to support the top and bottom edges of the vertically disposed backplane (170). In accordance with the assemblies described above, a front extrusion (100a) and a rear extrusion (100b) are secured to a top edge of the backplane (170) with alignment pins (130; FIG. 7). Similarly, another front extrusion (100a) and rear extrusion (100b) are secured to a bottom edge of the backplane (170) with alignment pins (130; FIG. 7).

A card cage wall (180) is provided on each side of the assembly. In FIG. 8, only one of the card cage walls (180) is illustrated to allow a view of the extrusion/backplane assembly within the card cage (181). However, it will be understood that another card cage wall is provided, opposite that shown, to support the other end of the extrusion/backplane assembly.

As described above in connection with FIG. 5, each end of the bar (104) and each end of the interface (101) on rear extrusions (100b), and each end of the interface (101) on the front extrusions (100a), includes a threaded hole (151) into which a screw (152) can be screwed. These screws are threaded through corresponding holes in the card cage walls (180) and into the holes (151) in the extrusion assemblies. In this way, the extrusions (100a, 100b) are attached to the walls of the card cage (181).

The assembly process for the card cage of FIG. 8 will now be described in more detail as it is actually performed. First, the rear extrusions (100b) are assembled into the card cage (181) with eight screws total. The rear extrusions (100b) are placed between the side walls (180) of the cage (181) through the open front (182) of the cage (181) and secured in place. The screws are put in loosely and will be tightened after the backplane (170) is in place. After than, the screws in the rear extrusions (100b) may never have to be adjusted again since the backplane location dimensions are set.

At this point, the backplane (170) can be added. An Industry Standard CPCI or VME style backplane can be used. Holes are added to the top and bottom of the backplane that line up directly with the holes for the alignment pins located in the extrusions (100a, 100b). These holes preferably provide a very close fit to the outer diameter of the central length (133; FIG. 3) of the pins (130; FIG. 3). When the backplane (170) is installed onto the rear extrusions (100b) by way of the open front of the card cage (181), the backplane (170) simply slides over the pins and provides a perfect separation distance between the upper and lower rear extrusions (101b).

Next, the front extrusions (100a) are added. It should be noted that the plastic card guides are preferably installed on both the front and rear extrusions (100a, 100b) before the extrusions (100a, 100b) are added to the card cage (181). To install the front extrusions (100a) to the backplane (170), it is possible to simply slide the front extrusions (100a) through the open front (182) of the card cage (181) until they nest onto the hex alignment pins (130; FIG. 3) protruding through the backplane (170).

Finally, the side walls (only one shown) of the card cage (180) are attached to the front extrusions with four screws total to hold them securely into place.

If it ever becomes necessary to repair or replace the backplane (170), only the two screws on each sidewall of the card cage (181) holding the front extrusions needs to be removed, and the front extrusions (100a) on top and bottom simply slide out. The malfunctioning backplane (170) can then be removed from the assembly for replacement or repairs.

When repairs are complete, the backplane (170) is replaced, the front extrusions (101a) are reinstalled and the card cage (181) closed. This can all be done in a fraction of the time it takes to repair an industry standard card cage. In the case of a racked product (most CPCI and VME products are racked), one can slide the computer out of the rack a couple of inches to access the front side mounted screws of the front card cage wall (two near the front of each extrusion). This is a tremendous advantage because the product does not have to be lifted out of the rack for a backplane replacement.

Thus, the present invention provides an improved method and structure for supporting a backplane and card guides. The one-piece, extruded construction of the extrusions used in the present invention is very cost effective.

The assembly and disassembly are made easy, thereby greatly facilitating any necessary repair work. Additionally, it is not necessary to remove a computer stored in a rack from the rack in order to effect repairs. The ability to more readily make repairs contributes to decreased warranty and labor costs for the manufacturing, thereby providing a competitive edge.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A system for supporting card guides and a backplane, said system comprising:
   at least one member having a first edge along which is disposed a bar for abutting said backplane; and
   at least one card guide attached to said member, said card guide comprising a plurality of slots for supporting a plurality of circuit boards on said member,
   wherein said card guide attaches only to said member and said circuit boards such that said card guide and member can be treated as a single unit during disassembly.

2. The system of claim 1, further comprising air holes through said member between said first and second edges.

3. The system of claim 1, further comprising a releasable fastener for receiving and fastening at least one said card guide to said member.

4. The system of claim 3, wherein said fastener comprises holes in said member into which said card guide is snapped.

5. The system of claim 1, further comprising a second edge of said member along which is disposed an interface, wherein said interface is formed according to a Compact Peripheral Component Interconnect (CPCT) standard or a Versa Modular Eurocard (VME) standard.

6. The system of claim 1, wherein said member is made of extruded aluminum.

7. The system of claim 1, wherein said bar further comprises a number of holes sized to receive an alignment pin.

8. The system of claim 7, further comprising a plurality of alignment pins for securing said member to said backplane.

9. The system of claim 1, wherein said member is made of metal and said card guide is made of plastic.

10. The system of claim 9, wherein said card guide snaps to holes in said member.

11. The system of claim 9, wherein said metal comprises aluminum.

12. An assembly comprising:
   a backplane;
   a front member;
   a rear member; and
   a plurality of alignment pins;
   wherein said backplane is supported between said front and rear members, said alignment pins being inserted through corresponding holes in said backplane and said front and rear members.

13. The assembly of claim 12, wherein said members are of different sizes.

14. The assembly of claim 12, wherein each of said members comprises:
   a first edge along which is disposed a bar abutting said backplane; and
   a second edge along which is disposed a standard interface.

15. The assembly of claim 14, wherein each of said members further comprises air holes between said first and second edges.

16. The assembly of claim 12, further comprising a card guide fastened to each of said members.

17. The assembly of claim 16, wherein each of said members comprise holes into which a card guide is snapped.

18. A card cage comprising:
   first and second card cage walls;
   a first, upper pair of members, comprising a front and a rear member, supported between said first and second card cage walls;

a second, lower pair of members, comprising a front and a rear member, supported between said first and second card cage walls;

a backplane supported between said front members and said rear members; and a plurality of alignment pins;

wherein said alignment pins are inserted through corresponding holes in said backplane and said front and rear members.

19. The card cage of claim 18, wherein said front members are of a different size than said rear members.

20. The card cage of claim 18, wherein each of said members comprises:

a first edge along which is disposed a bar abutting said backplane; and a second edge along which is disposed a standard interface.

21. The card cage of claim 20, wherein each of said members further comprises air holes between said first and second edges.

22. The card cage of claim 18, further comprising a card guide fastened to each of said members.

23. The card cage of claim 22, wherein each of said members comprise holes into which a card guide is snapped.

24. The card cage of claim 18, wherein said pairs of members are attached to said card cage walls with screws.

25. A method of assembling a card cage, said method comprising:

supporting a pair of rear members between first and second card cage walls, said rear members being spaced apart vertically;

connecting a backplane to said members; and supporting a pair of front members between said first and second card cage walls, said front members being spaced apart vertically and supporting said backplane along with said rear members.

26. The method of claim 25, further comprising inserting a plurality of alignment pins through corresponding holes in said backplane and said front and rear members.

27. The method of claim 25, wherein said front members are of a different size than said rear members.

28. The method of claim 25, wherein supporting said pairs of members comprises screwing said members to said card cage walls.

29. The method of claim 25, further comprising securing a front wall to said card cage.

30. The method of claim 29, wherein said securing a front wall further comprises securing said front wall with only two screws.

31. The method of claim 25, further comprising installing a card guide on each of said members.

32. The method of claim 31, wherein said installing a card guide further comprises snapping a card guide to each of said members.

33. A method of disassembling a card cage for repair or replacement of a backplane contained in said card cage, said method comprising:

removing front member screws of said card cage;

removing two front members supported between left and right side walls of said card cage, wherein said two front members help support said backplane, and removing said front members exposes said backplane; and repairing said backplane.

34. A card cage assembly comprising:

means for supporting a pair of rear members between first and second card cage walls, said rear members being spaced apart vertically;

means for connecting a backplane to said members; and means for supporting a pair of front members between said first and second card cage walls, said front members being spaced apart vertically and supporting said backplane along with said rear members.

* * * * *